United States Patent [19]
Oba et al.

[11] Patent Number: 5,761,957
[45] Date of Patent: Jun. 9, 1998

[54] SEMICONDUCTOR PRESSURE SENSOR THAT SUPPRESSES NON-LINEAR TEMPERATURE CHARACTERISTICS

[75] Inventors: Nobukazu Oba, Gamagori; Yasutoshi Suzuki; Inao Toyoda, both of Okazaki; Masaki Onoue, Nagoya, all of Japan

[73] Assignee: Denso Corporation, Kariya, Japan

[21] Appl. No.: 796,117

[22] Filed: Feb. 6, 1997

[30] Foreign Application Priority Data

Feb. 8, 1996 [JP] Japan ................... 8-22839
Dec. 24, 1996 [JP] Japan ................... 8-344024

[51] Int. Cl.$^6$ .................... G01L 9/06; H01C 17/28
[52] U.S. Cl. ........................ 73/727; 29/621.1
[58] Field of Search .................... 73/720, 721, 726, 73/727, 706, 708, 754, 777, DIG. 4; 338/4, 42; 29/621.1

[56] References Cited

U.S. PATENT DOCUMENTS 5,289,721   3/1994   Tanizawa et al. .................... 73/727

FOREIGN PATENT DOCUMENTS 4-25767    1/1992   Japan.
4-114478   4/1992   Japan.
4-34091    6/1992   Japan.

*Primary Examiner*—William L. Oen
*Attorney, Agent, or Firm*—Cushman, Darby & Cushman IP Group of Pillsbury, Madison & Sutro LLP

[57] ABSTRACT

A semiconductor pressure sensor includes a diaphragm of an octagonal shape formed on a (110) silicon substrate by anisotropic etching. When a distance between two sides of the diaphragm, which are defined by intersecting lines of a (110) face and a (111) face of the silicon substrate, is represented as L1 and a length of a side of the diaphragm, which is defined by an intersecting line of the (110) face and a (100) face, is represented as L2, the diaphragm is formed so as to satisfy the following relationship:

$$0.65 < L2/L1 < 1.$$

As a result, it is possible to eliminate substantially a non-linear component of the temperature characteristics of an offset voltage generated by the pressure sensor.

5 Claims, 8 Drawing Sheets

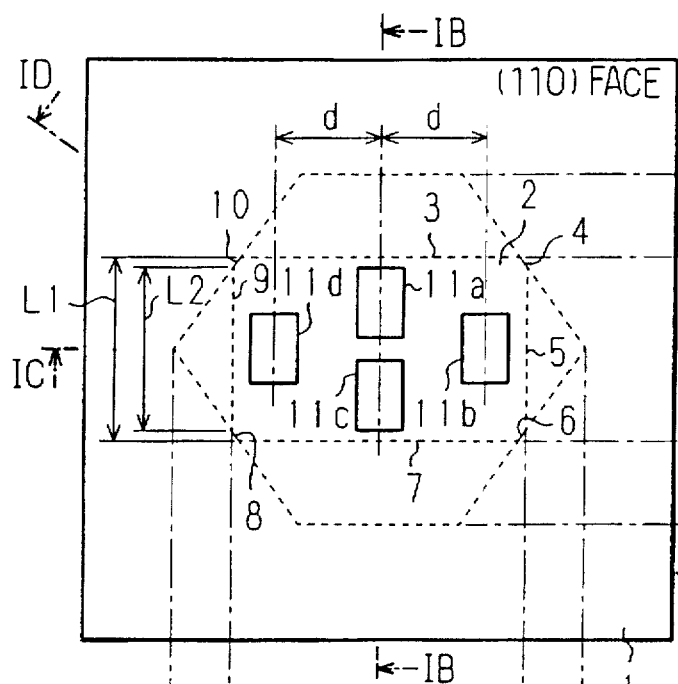
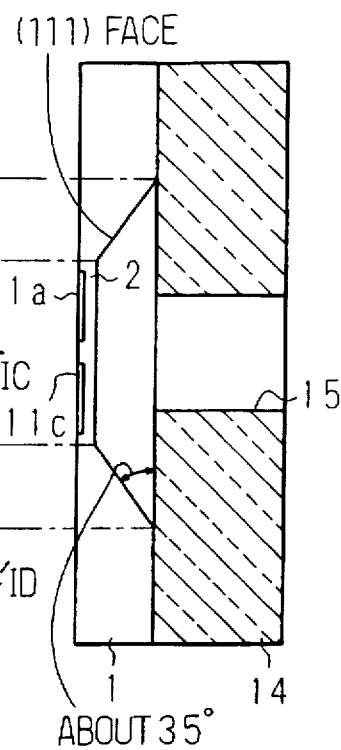
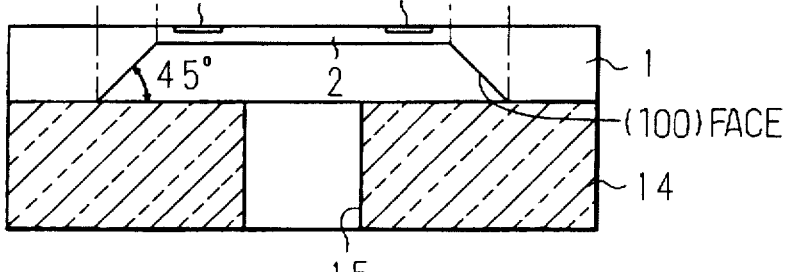
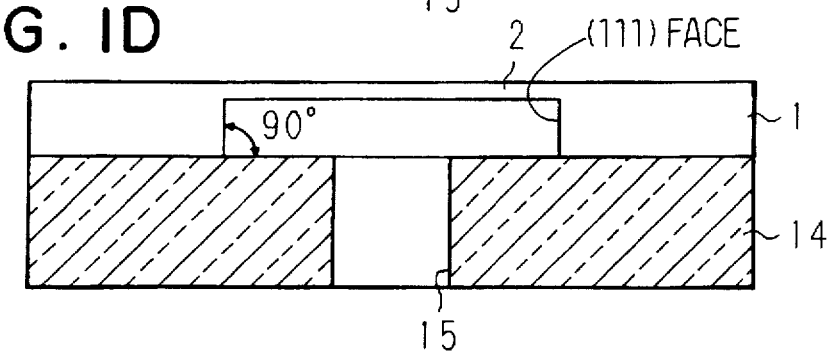

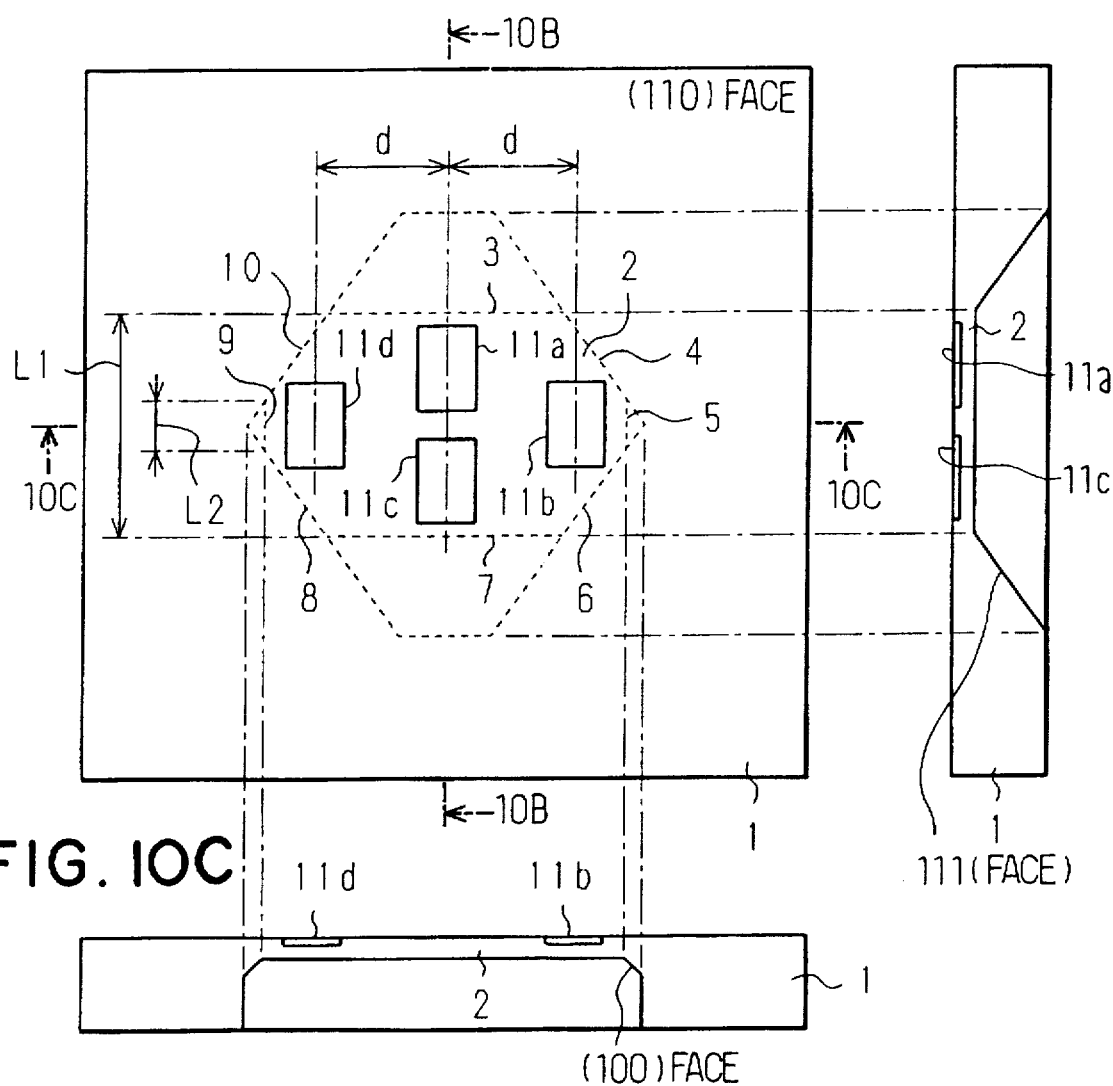

SEMICONDUCTOR PRESSURE SENSOR THAT SUPPRESSES NON-LINEAR TEMPERATURE CHARACTERISTICS

CROSS REFERENCE TO RELATED APPLICATION

This application is based upon and claims priority from Japanese Patent Applications No. Hei. 8-22839 filed Feb. 8, 1996 and No. Hei. 8-344024 filed Dec. 24, 1996, the contents of which are incorporated herein by reference.

BACKGROUND OF THE INVENTION

1. Field of the Invention

The present invention relates to a semiconductor pressure sensor having a thin diaphragm in a part of a silicon substrate.

2. Description of the Related Art

Japanese Patent Application Laid-Open Publication No. 4-119672 discloses a semiconductor pressure sensor having a diaphragm in a part of a silicon substrate. In this semiconductor pressure sensor, the form of the diaphragm (sensing portion) is changed from a rectangular shape to an octagonal shape to minimize the variation of an offset voltage caused by temperature changes. The offset voltage is an output voltage under a reference pressure.

However, only a linear component of the variation of the offset voltage has been treated in the prior art. Such a liner component of the offset voltage variation can be compensated for example, by a temperature compensating circuit. A more critical factor among temperature characteristics of the offset voltage is the non-linear component of the offset voltage variation.

A semiconductor pressure sensor is actually used in a temperature range from 30° C. to 100° C. or 120° C. Therefore, the non-linear component of the temperature characteristic needs to be considered in not only a high temperature region but also in a low temperature region.

In recent years, there has been a demand for a semiconductor pressure sensor having a high accuracy from a low temperature region through a high temperature region. However, a conventional pressure sensor can not sufficiently meet such a demand because the accuracy of detecting pressure deteriorates in the low temperature range due to the non-linear component of the temperature characteristics.

The temperature characteristics of the offset voltage will be explained in detail with reference to FIG. 13. In FIG. 13, an axis of ordinate represents an offset voltage when an offset voltage at a temperature of 25° C. is set to be a reference offset voltage (0 mV). An axis of abscissa represents temperature. From FIG. 13, it is obvious that the offset voltage of the semiconductor pressure sensor varies depending on temperature, and, further, the offset voltage variation has not only a linear component but also a non-linear component. Here, the non-linear component is defined as follows: An offset voltage $P_{25}$ at a normal room temperature (25° C.), an offset voltage $P_{100}$ at a highest temperature (100° C. in FIG. 13) and an offset voltage $P_{-30}$ at a lowest temperature (−30° C. in FIG. 13) are determined. A straight line (which is shown by a dotted line in FIG. 13) is drawn so as to pass through the offset voltage $P_{25}$ at 25° C. and the offset voltage $P_{100}$ at the highest temperature (100° C.). An offset value $P_{-30}'$ is derived from a value of the straight line at a temperature of −30° C. A difference $\Delta P$ between the offset value $P_{-30}'$ and the offset voltage $P_{-30}$ is defined as a non-linear component of the temperature characteristics.

Since the non-linear component deteriorates the detecting accuracy of the pressure sensor, it is desirable to reduce the non-linear component of the temperature characteristics.

Incidentally, in FIG. 13, the offset voltage of the pressure sensor was measured while the temperature was changed in the way of 25° C. → −30° C. → 100° C. → 25° C. There are illustrated two measurement lines in FIG. 13 due to hysteresis of the measured offset voltage.

SUMMARY OF THE INVENTION

The present invention has been made in view of the above-mentioned problems and its object is to provide a semiconductor pressure sensor that is capable of suppressing a non-linear component of temperature characteristics of an offset voltage from a low temperature of about −30° C. through a high temperature of about 100° C.

According to the present invention, a diaphragm of an octagonal shape is formed on a (110) silicon substrate by a anisotropic etching. When a distance between two sides of the diaphragm, which are defined by intersecting lines of a (110) first face and a (111) second face of the silicon substrate, is represented as L1 and a length of a side of the diaphragm, which is defined by an intersecting line of the (110) first face and a (100) third face, is represent as L2, the diaphragm is formed so as to satisfy the following relationship:

$$0.65 < L2/L1 < 1.$$

As a result, it is possible to eliminate substantially a non-linear component of the temperature characteristics of an offset voltage generated by the pressure sensor. Accordingly, the offset voltage varies approximately linearly in response to temperature change.

It is preferable that the diaphragm be formed so as to satisfy the following relationship so as to reliably eliminate the non-linear component of temperature characteristic:

$$0.7 \leq L2/L1 \leq 0.9.$$

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIG. 1A is a plan view illustrating a semiconductor pressure sensor according to a first embodiment;

FIG. 1B is a sectional view taken along the line 1B—1B of FIG. 1A;

FIG. 1C is a sectional view taken along the line 1C—1C of FIG. 1A;

FIG. 1D is a sectional view taken along the line 1D—1D of FIG. 1A;

FIG. 10A is a plan view illustrating a semiconductor substrate to explain output characteristics;

FIG. 10B is a sectional view taken along the line 10B—10B of FIG. 10A;

FIG. 10C is a sectional view taken along the line 10C—10C of FIG. 10A;

DETAILED DESCRIPTION OF THE PREFERRED EMBODIMENTS

Figure 2:
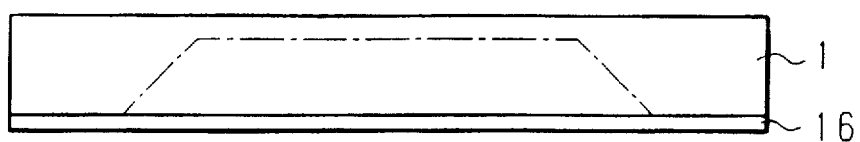
FIG. 2 is a sectional view illustrating a step of producing the semiconductor pressure sensor illustrated in FIGS. 1A to 1D.

A first embodiment of a semiconductor pressure sensor according to the present invention will now be described with reference to the accompanying drawings.

FIG. 1A is a plan view illustrating the semiconductor pressure sensor, and FIGS. 1B to 1D are sectional views thereof.

In FIGS. 1A to 1D, a silicon substrate 1 of which an upper face has a (110) face is used as a sensor chip. At a center portion of silicon substrate 1, thin diaphragm 2 is formed by anisotropic etching. Diaphragm 2 is formed into an octagonal shape and thereby has eight sides 3 to 10. That is, diaphragm 2 has sides 3 and 7 which are defined as intersecting lines of a (110) face, and a (111) face which has an angle of about 35.3° with respect to the (110) face, sides 5 and 9 which are defined as intersecting lines of the (110) face and a (100) face, which has an angle of 45° with respect to the (110) face, and sides 4, 6, 8 and 10, which are defined as intersecting lines of the (110) face, and a (111) face, which has an angle of 90° with respect to the (110) face.

When a distance between two sides 3 and 7 of the diaphragm 2 is represented as L1 and a length of sides 5 and 9 of diaphragm 2 is represent as L2, diaphragm 2 is formed so as to satisfy the following relationship:

0.65<L2/L1<1.

Incidentally, when L2/L1=1, since diaphragm become a rectangle, sides 4, 6, 8 and 10 do not exist in diaphragm 2. Further the unit of L1 is the same as that of L2.

Strain gauges (piezo resistance elements) 11a and 11c made from impurity diffusion layers are formed at the center portion of diaphragm 2 with a predetermined distance therebetween. Longitudinal sides of the strain gauges 11a and 11c are in parallel to the sides 5 and 9 of the diaphragm 2. In addition, strain gauges (piezo resistance elements) 11b and 11d are formed at the periphery of the diaphragm 2 with a predetermined distance therebetween. Longitudinal sides of the strain gauges 11b and 11d are also in parallel to the sides 5 and 9. Strain gauges 11b and 11d disposed on the left and right sides in the plan view of FIG. 1A are referred to as side gauges and the central position therebetween matches the center of the diaphragm 2.

Silicon substrate 1 is bonded on a glass base 14. A pressure introducing hole 15 is formed at the center of glass base 14. Pressure is applied to diaphragm 2 through pressure introducing hole 15.

In the constitution described above, the sensor chip is formed into the following size. The thickness of silicon substrate (chip) 1 is 300 μm. The thickness of diaphragm 2 is in a range of 11 to 15 μm. The length and width of diaphragm 2 are 1.4 mm and 1.3 mm, respectively. Therefore, L1 is 1.3 mm. The length and width of silicon substrate 1 are 2.7 to 3.3 mm and 2.7 to 3.3 mm, respectively. The length and width of strain gauges 11a to 11d are 320 to 406 μm and 160 to 224 μm, respectively. Further, side gauges 11b and 11d are away in left and right sides in FIG. 1A from the center of diaphragm 2 by 579±25 μm.

Next, a manufacturing process of silicon substrate 1 having diaphragm 2 will be explained.

First, silicon substrate 1 of a flat plate shape is prepared as shown in FIG. 2. Strain gauges (impurity diffusion layers) 11a to 11d are formed at predetermined positions on a surface of silicon substrate 1 by an ion implantation or the like. Silicon nitride film 16 is formed on a face opposed to the face from which the impurity is diffused into silicon substrate 1.

Figure 3:
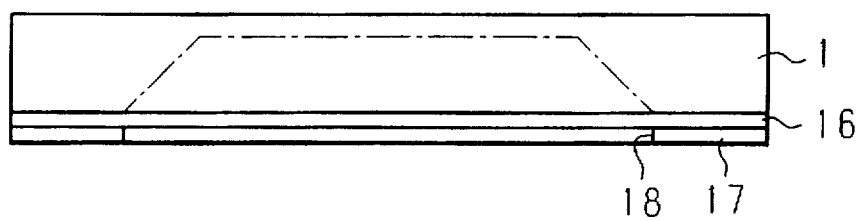
FIG. 3 is a sectional view illustrating a step of producing the semiconductor pressure sensor illustrated in FIGS. 1A to 1D.
Figure 4:
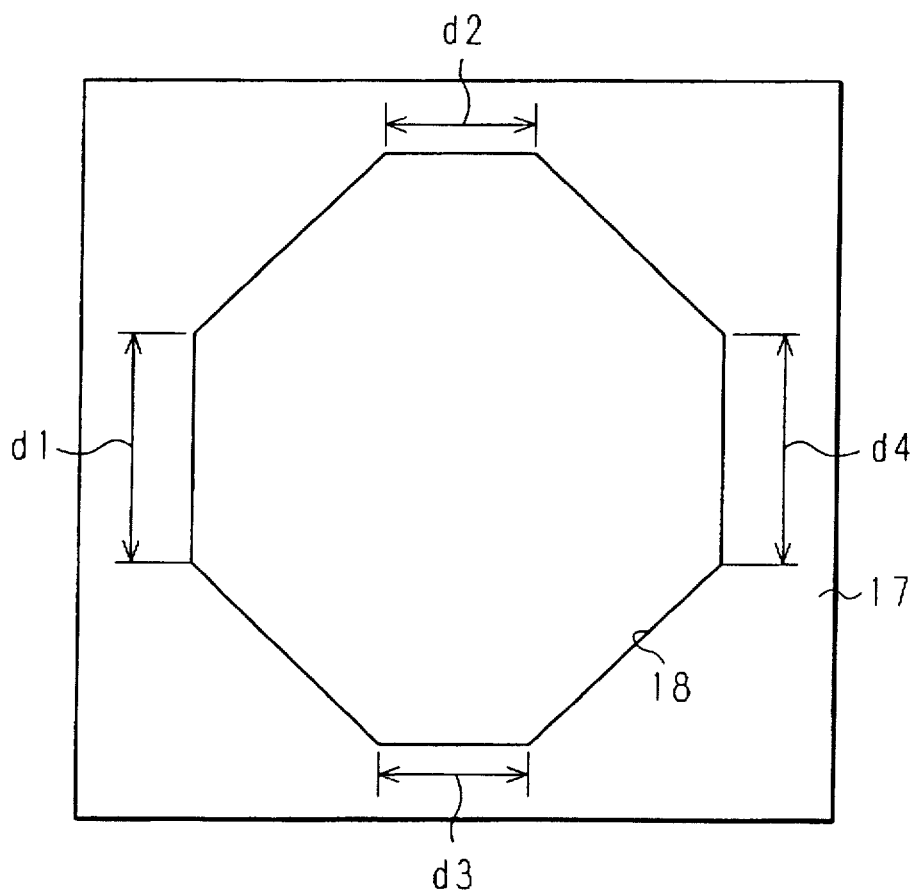
FIG. 4 is a plan view illustrating a mask used for an anisotropic etching.
Figure 5:
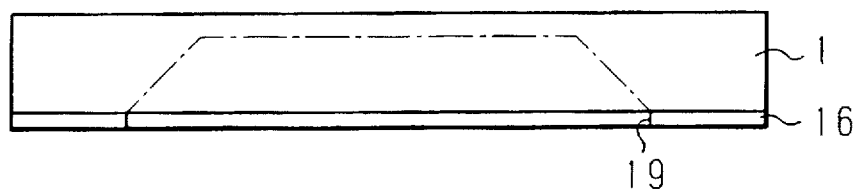
FIG. 5 is a sectional view illustrating a step of producing the semiconductor pressure sensor illustrated in FIGS. 1A to 1D.

Then, a pattern mask 17 is disposed on silicon nitride film 16 as shown in FIG. 3. In pattern mask 17, an opening portion of a desirable shape is formed as shown in FIG. 4. Accordingly, silicon nitride 16 is etched by using the pattern mask 17 to form an opening portion 19 of a desirable shape in silicon nitride 16.

Figure 6:
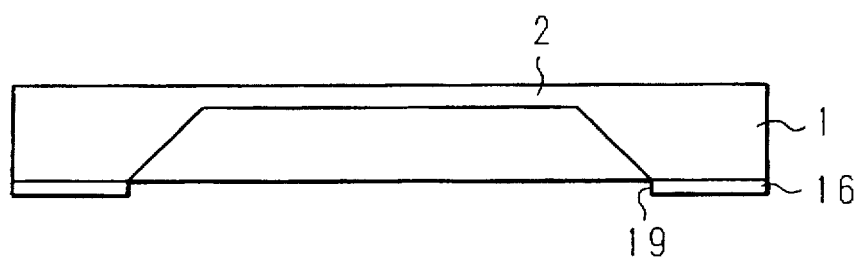
FIG. 6 is a sectional view illustrating a step of producing the semiconductor pressure sensor illustrated in FIGS. 1A to 1D.

Further, as shown in FIG. 6, thin diaphragm 2 is formed by executing anisotropic etching such as a KOH while using silicon nitride 16 as a mask. At this time, the lengths of d1, d2, d3 and d4 in FIG. 4 is set to predetermined values in order that L2/L1 in diaphragm 2 of an octagon shape is in a range of 0.65 to 1.0.

Silicon nitride film 16 can be replaced with a silicon oxidation film.

Figure 7:
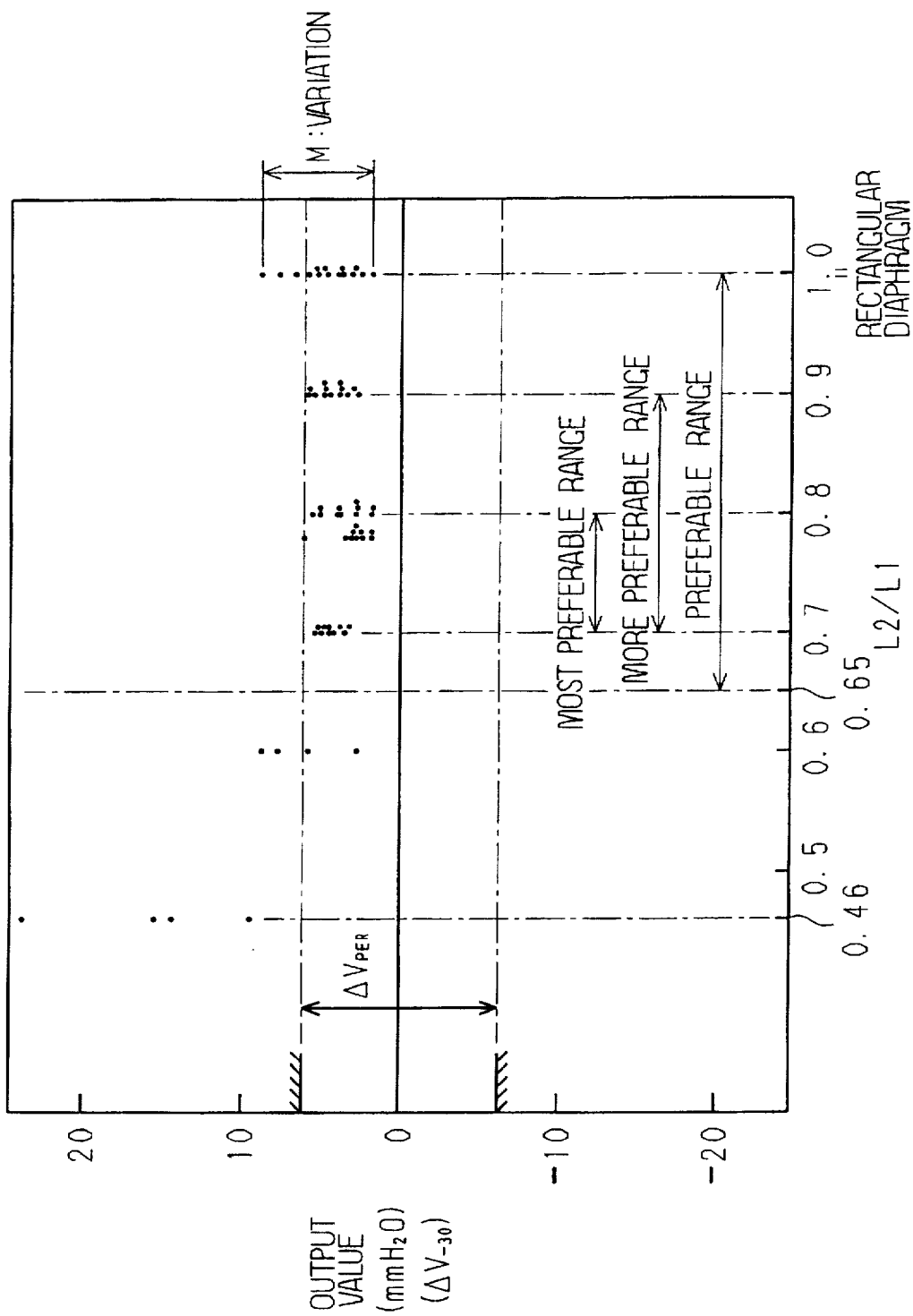
FIG. 7 is a graph illustrating results measuring variations of output values.
Figure 8:
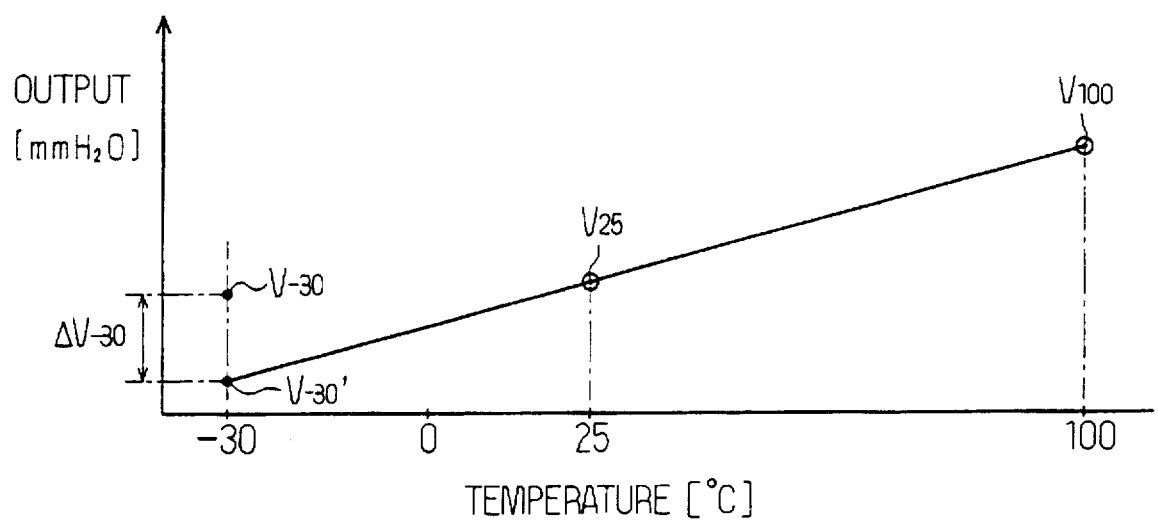
FIG. 8 is a graph illustrating a method measuring variations of output values.

FIG. 7 is a graph illustrating an estimated result with respect to a non-linear component of temperature characteristics of an offset voltage (sensor output) in an experimental model.

Axis of abscissa in FIG. 7 represents L2/L1, and axis of ordinates therein represents a difference $\Delta V_{-30}$ between an offset voltage $V_{-30}$ at temperature of −30° C. and an offset value $V_{-30}$ derived by extending a straight line connecting an offset voltage $V_{25}$ at temperature of 25° C. and an offset voltage $V_{100}$ at temperature of 100° C. In FIG. 7, the unit of the difference $\Delta V_{-30}$ is converted to mmH$_2$O.

Figure 9:
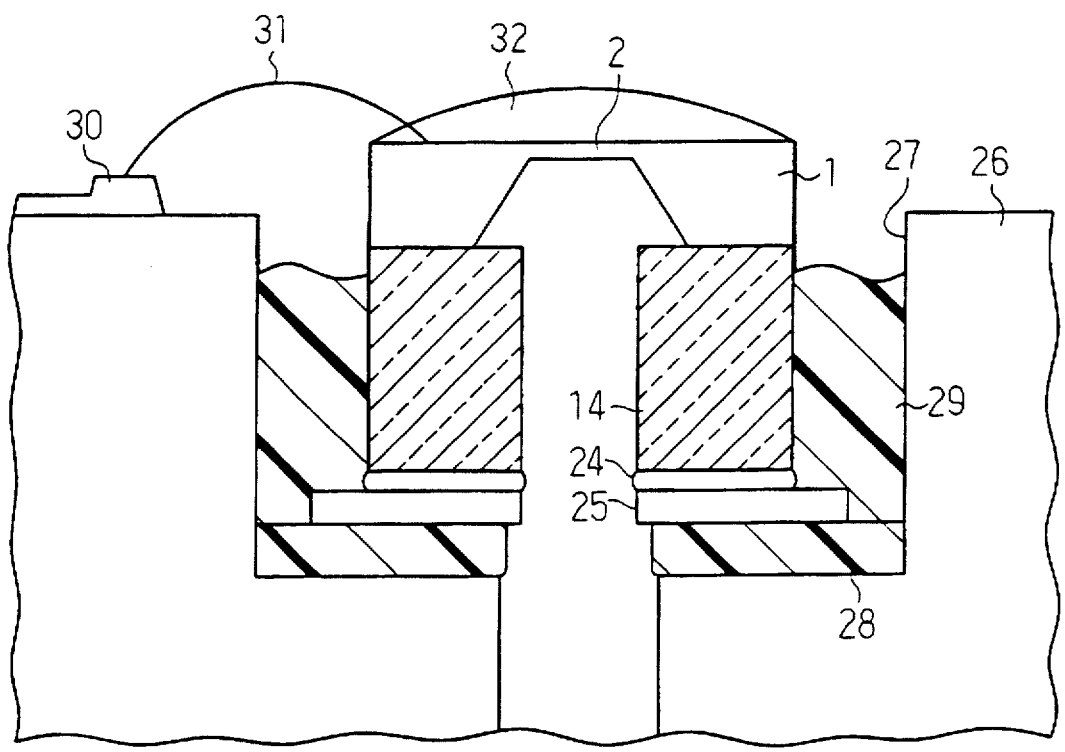
FIG. 9 is a sectional view illustrating a sample for the measurement.

The experimental model which was used to obtain data shown in FIG. 7 is shown in FIG. 9.

In FIG. 9, the size of the sensor chip is the same as that described before. A base 14 is made from glass and thickness thereof is 2.5 mm. Base 14 is bonded to a metallic plate 25 by solder 24. After that, the experimental model is bonded to a recess portion 27 formed in a resin case (PBT) 26 with adhesives 28 and 29. Adhesives 28 and 29 are ones of phloro-silicon system. Metallic plate is made from 42 alloy, the length and width thereof are 4 mm and 4 mm, and the thickness thereof is 0.8 mm.

A Metallic wire pad on the surface of silicon substrate (silicon chip) 1 is connected to a lead frame 30 on resin case 26 by a metallic wire 31. Further, to prevent contamination of the surface, gel 32 is coated on the surface of the silicon chip and wire-bonding portions on lead frame 30.

From FIG. 7, it is understood that when L2/L1 is within a range of 0.65 to 1.0, the sensor of the first embodiment meets a condition of 1% FS which is a performance required to a pressure sensor. The condition of 1% FS is illustrated as an allowable range $\Delta V_{PER}$ in FIG. 7. In FIG. 7, when L2/L1=0.46, the difference $\Delta V_{-30}$ becomes large. As the value of L2/L1 becomes larger than 0.46, the difference $\Delta V_{-30}$ becomes smaller. In particular, in a range where L2/L1 is 0.7 or more, the difference $\Delta V_{-30}$ approaches zero. The reason why the difference $\Delta V_{-30}$ approaches zero is extrapolated as described below.

When diaphragm 2 having a shape that L2/L1 is large as shown in FIG. 1 is compared with diaphragm 2 having a shape that L2/L1 is small as shown in FIG. 10, if the value of L1 is constant, sides 4, 6, 8 and 10 of diaphragm 2 in FIG. 10 become closer to strain gauges 11a to 11d than those of diaphragm 2 in FIG. 1. As a result, when L2/L1 is small, thermal stress generated in the vicinity of sides 4, 6, 8 and 10 of diaphragm 2 affects strain gauges 11a to 11d. That is, the thermal stress generated in the vicinity of sides 4, 6, 8 and 10 breaks the balance of thermal stress applied to strain gauges 11a to 11d which are resistors constituting a full bridge circuit. As a result, the stress applied to strain gauges 11a to 11d in response to the thermal stress generated at sides 4, 6, 8 and 10 of octagonal diaphragm 2 is different depending on the change of atmosphere temperature. Consequently, the linearity of the temperature characteristics of the difference $\Delta V_{-30}$, i.e., the offset voltage, deteriorates. In other words, when L2/L1 is large, an influence of the thermal stress generated at sides 4, 6, 8 and 10 of diaphragm 2 can be reduced and the balance of the thermal stresses applied to strain gauges 11a to 11d can be maintained.

The reason why the difference $\Delta V_{-30}$ does not become zero in a range of L2/L1>0.7, is that strain gauges 11a to 11d receive the influence of thermal stress from a protective layer (not shown) covering the surface of silicon substrate 1, glass base 14 or the like. That is, at a junction portion or bonding portion between silicon substrate 1 and the other part made from the material other than silicon, thermal stress is generated due to the difference between coefficients of thermal expansion thereof. The thermal stress is transmitted to strain gauges 11a to 11d. As a result, even if the value of L2/L1 is optimized, the difference $\Delta V_{-30}$ does not become zero.

In FIG. 7, when L2/L1=1, i.e., diaphragm 2 has a rectangular (or square) shape, the variation of the difference $\Delta V_{-30}$ is wide as shown by line M. The reason why the variation of difference $\Delta V_{-30}$ is wide when L2/L1=1 is extrapolated as described below.

Figure 11A:
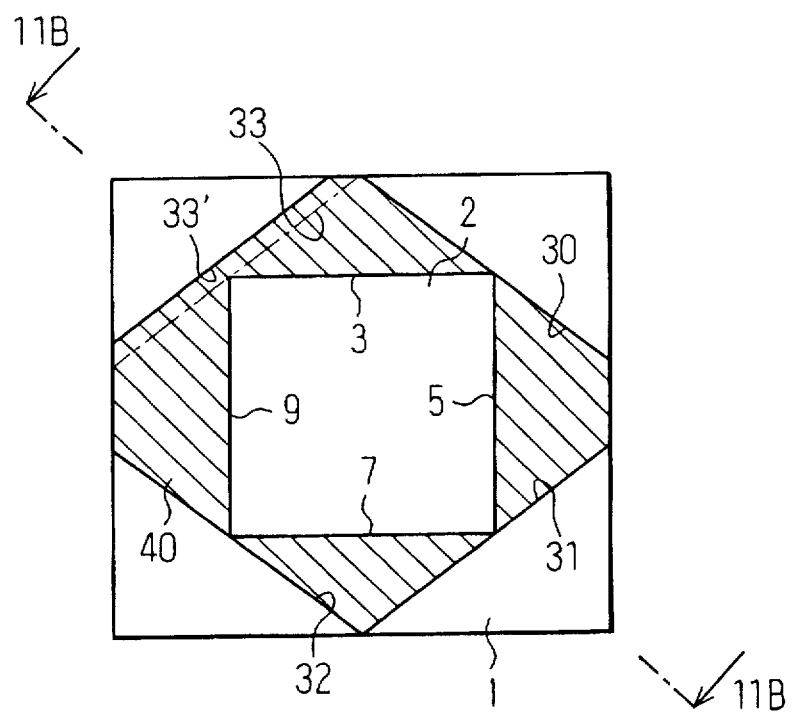
FIG. 11A is a plan view illustrating a semiconductor substrate to explain output characteristics.
Figure 11B:
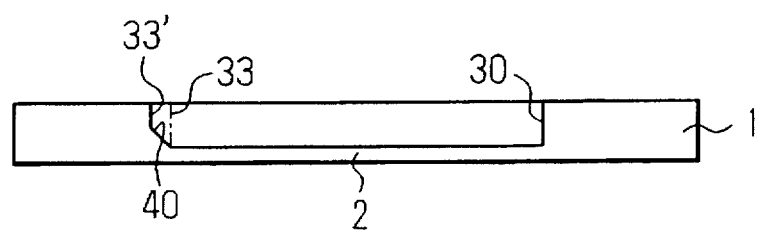
FIG. 11B is a sectional view taken along the line 11B—11B of FIG. 11A.
Figure 12:
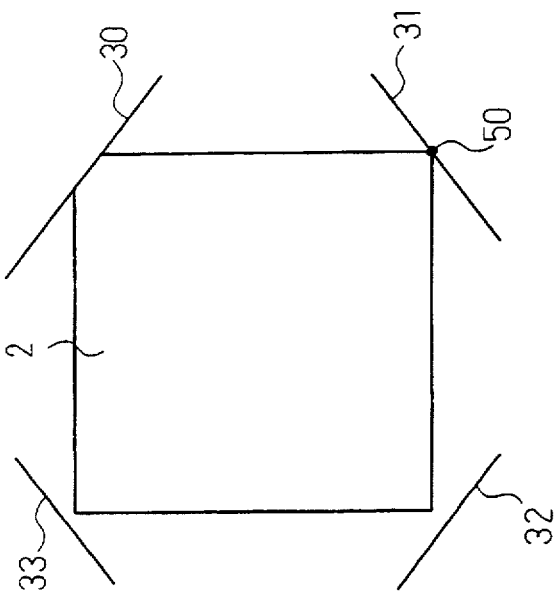
FIG. 12 is a plan view illustrating a semiconductor substrate to explain an output characteristics.
Figure 13:
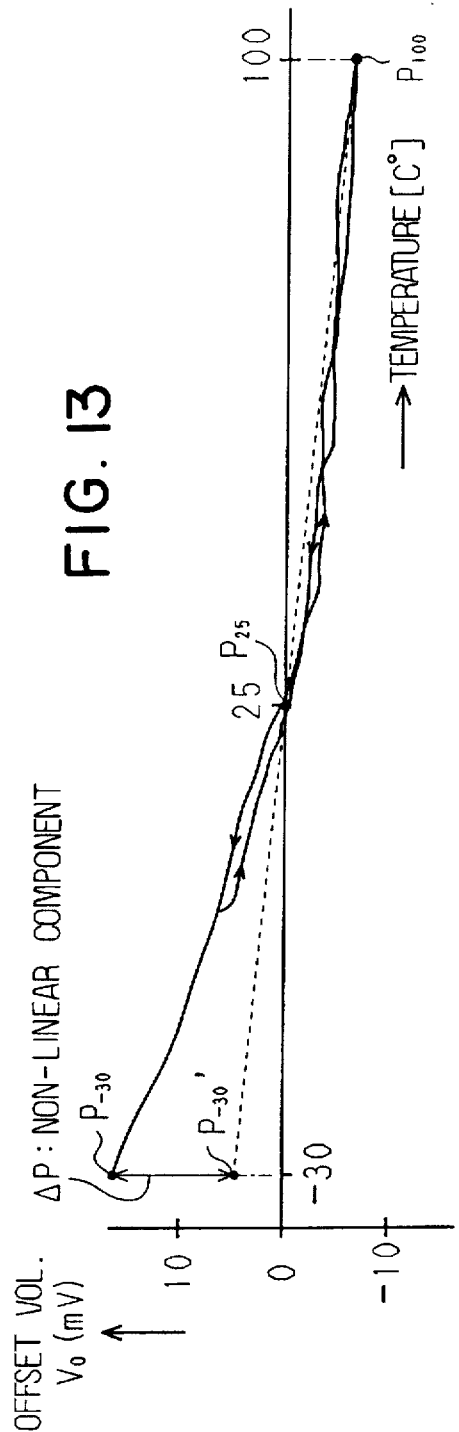
FIG. 13 is a graph illustrating a non-linear component among temperature characteristics of the offset voltage.

Silicon substrate 1 having a square diaphragm 2 (in this case, L2/L1=1) is shown in FIGS. 11A and 11B. FIG. 11A is a plane view illustrating a rear face of silicon substrate 1 and FIG. 11B is a sectional view taken along the line 11B—11B of FIG. 11A. A hatched area 40 indicates a slope (taper face) from a base face of thick silicon substrate 1 to sides 3, 5, 7 and 9 of thin diaphragm 2. In FIG. 11A, there is a side (vertical face) 30 at the intersection of sides 3 and 5 of diaphragm 2, there is a side (vertical face) 31 at the intersection of sides 5 and 7 of diaphragm 2, there is a side (vertical face) 32 at the intersection of sides 7 and 9 of diaphragm 2 and there is a side (vertical face) 33 at the intersection of sides 3 and 9 of diaphragm 2. However, if the positioning of side 33 deviates to side 33' in FIG. 11A due to manufacturing error, then although sides 30, 31 and 32 perpendicular to the surface of silicon substrate 1 are formed below the three corners of square diaphragm 2 in corners other than the fourth corner where the side 33' is formed, a tapered face 40 is formed below the fourth corner of square diaphragm 2. Side 33 is positioned away from the position of the fourth corner of diaphragm 2. Therefore, when L2/L1=1, either one of a side perpendicular to the surface of silicon substrate 1 and a taper face diagonal to the surface thereof is formed below each corner of square diaphragm 2. Because of manufacturing error in performing the processing of the silicon substrate 1, the positions of the sides 30 to 33 shown in FIG. 11A may deviate depending on a chip wafer or lot, or relative relation with respect to the positions of sides 30 to 33 may vary. In FIG. 12, an example is shown such that side 31 coincides with the corner 50, but the other three sides 30, 32 and 33 deviate from the corresponding corner of diaphragm 2.

As described before, the difference $\Delta V_{-30}$ receives an influence of thermal stress applied to strain gauges 11a to 11d. Accordingly, when sides 30 to 33 are formed into a state shown in FIGS. 11A or 12, the balance of the thermal stress applied to strain gauges 11a to 11d can not be held. As a result, the variation M of the difference $\Delta V_{-30}$ becomes wide as shown in FIG. 7.

In view of all of the above, preferable range of L2/L1 is 0.65<L2/L1<1, as indicated in FIG. 7. Further, when the value of L2/L1 is in a range of 0.7 to 0.9, plotted points are within the allowable range $\Delta V_{PER}$. Therefore, more preferable range thereof is $0.7 \leq L2/L1 \leq 0.9$. Furthermore, most preferable range thereof is $0.7 \leq L2/L1 \leq 0.8$.

In the first embodiment, a liner component of temperature characteristics of the offset voltage is compensated by a temperature compensating circuit (not shown).

The present invention is not limited to the first embodiment, and it can be modified in various ways without departing from the spirit and the scope of the claimed invention.

For example, although four strain gauges 11a to 11d were formed in diaphragm 2 and the four strain gauges 11a to 11d make a full bridge circuit in the first embodiment, two strain gauges may be formed in diaphragm to make a half bridge circuit.

Further, as long as the value of L2/L1 of diaphragm 2 is within a range of 0.65 to 1.0, the size and thickness of silicon substrate 1 or the size and thickness of diaphragm 2 can be flexibly designed. In addition, the size, shape or impurity concentration of the strain gauge is not limited to a specific value, and it is sufficient for the strain gauge to be formed in the diaphragm and connected to an electrical circuit.

Base 14 can be formed by silicon, a multi-layer composition of glass and silicon or the like instead of glass. Further, the thickness of base 14 can be changed from 2.5 mm.

The protective layer and the metallic wiring can be deleted. Further, even when they are provided, any kind of protective layer and an metallic wiring can be adopted.

As the adhesive, the adhesive of epoxy family, silicon family or fluorine family can be used in the replacement of the adhesive of the phloro-silicon family.

Base 14 may be bonded to metallic plate 25 with an adhesive.

Gel 32 can be deleted.

Metallic plate 25 can be deleted as well. In this case, sensor chip and base 14 is bonded to the resin case with the adhesive.

The material of case 26 may not be resin (PBT or PPS) but metal, ceramic or the like. In this case, bonding is made by using a solder or adhesive.

The optimal range of L2/L1 may vary depending on the shape or material of each of the parts described above. Further, The optimal range of L2/L1 may also vary in response to temperature range in which the sensor is used.

What is claimed is:

1. A semiconductor pressure sensor comprising:

a silicon substrate of which a surface has a (110) face; and a diaphragm formed in said surface of said silicon substrate and having an octagonal shape, wherein, when a distance between two sides of said diaphragm, which are defined by intersecting lines of said (110) face and a (111) face of said silicon substrate, is represented as L1 and a length of a side of said diaphragm, which is defined by an intersecting line of said (110) face and a (100) face, is represented as L2, the diaphragm is formed so as to satisfy the following relationship:

$$0.65 < L2/L1 < 1.$$

2. A semiconductor pressure sensor according to claim 1, wherein said diaphragm is formed so as to satisfy the following relationship:

$$0.7 \leq L2/L1 \leq 0.9.$$

3. A semiconductor pressure sensor according to claim 1, wherein said diaphragm is formed in said surface of said silicon substrate by performing an anisotropic etching from a rear surface of said silicon substrate.

4. A semiconductor pressure sensor according to claim 1, further comprising at least two strain gauges disposed in said diaphragm, wherein a longitudinal side of each of said strain gauges is in parallel to said side of said diaphragm defined by said intersecting line of said (110) face and said (100) face.

5. A semiconductor pressure sensor according to claim 4, wherein four strain gauges are provided in said diaphragm and each of two pairs of said strain gauges are disposed to be symmetrical with respect to a center of said diaphragm.

* * * * *